United States Patent [19]

Kouzuma et al.

[11] Patent Number: 5,202,271
[45] Date of Patent: Apr. 13, 1993

[54] MANUFACTURING METHOD OF PHOTOVOLTAIC DEVICE

[75] Inventors: Shinichi Kouzuma, Hirakata; Hiroshi Inoue, Osaka; Kenji Murata, Kyoto; Hiroyuki Tanaka, Kadoma; Yasuo Kishi, Hirakata, all of Japan

[73] Assignee: Sanyo Electric Co., Ltd., Osaka, Japan

[21] Appl. No.: 808,444

[22] Filed: Dec. 16, 1991

[30] Foreign Application Priority Data

Dec. 27, 1990 [JP] Japan ................................. 2-408211
Sep. 11, 1991 [JP] Japan ................................. 3-231781

[51] Int. Cl.⁵ ........................................ H01L 31/18
[52] U.S. Cl. ............................ 437/3; 437/226; 437/227; 148/DIG. 28; 136/244; 136/246; 136/256; 136/258
[58] Field of Search ............... 437/2, 3, 4, 5, 226, 437/227; 148/DIG. 28; 136/244, 245, 246, 256, 258 AM, 258 PC; 427/375, 376.1, 376.2, 385.5, 386, 387, 289, 293

[56] References Cited

U.S. PATENT DOCUMENTS

| | | | |
|---|---|---|---|
| 4,612,409 | 9/1986 | Hamakawa et al. | 136/244 |
| 4,704,369 | 11/1987 | Nath et al. | 437/226 |
| 4,724,010 | 2/1988 | Okiniwa et al. | 136/246 |
| 4,816,324 | 3/1989 | Berman | 136/256 |
| 4,883,771 | 11/1989 | Kumabe et al. | 437/227 |
| 4,940,495 | 7/1990 | Weber et al. | 136/256 |
| 5,024,970 | 6/1991 | Mori | 148/DIG. 28 |
| 5,045,482 | 9/1991 | Yamazaki | 437/3 |
| 5,069,727 | 12/1991 | Kouzuma et al. | 437/4 |
| 5,133,810 | 7/1992 | Morizane et al. | 136/244 |

*Primary Examiner*—Brian E. Hearn
*Assistant Examiner*—Kevin M. Picardat
*Attorney, Agent, or Firm*—Darby & Darby

[57] ABSTRACT

A manufacturing method of a photovoltaic device, whereby a photovoltaic device of a large area in the laminated structure of a first resin layer with light-transmitting property, a photo-electric converting element consisting of a transparent electrode layer, a thin-film semiconductor layer and a back electrode layer, and a second resin layer in this order is mechanically cut into an optional size, which is followed by a step wherein the first and second resin layers of the cut photovoltaic device of a smaller area are thermally treated or at least one of the transparent electrode layer and back electrode layer at the section is etched and removed. Because of the above treatment for the cut photovoltaic device of a smaller area, an electric short circuit between the transparent electrode layer and back electrode layer at the section is prevented.

16 Claims, 4 Drawing Sheets

MANUFACTURING METHOD OF PHOTOVOLTAIC DEVICE

BACKGROUND OF THE INVENTION

1. Field of the Invention

This invention generally relates to a method for manufacturing a photovoltaic device and, more particularly to a manufacturing method of a flexible photovoltaic device using amorphous semiconductor.

2. Description of Related Art

A particular attention has been paid to the fact that a photovoltaic device using amorphous semiconductor, e.g., amorphous silicon or the like is manufactured at low cost. Since such a photovoltaic device as above is easily formed thin, flexibility is required as well.

Two kinds of structures are known for the photovoltaic device of a flexible type. One is achieved, as disclosed in Japanese Patent Application Laid-Open No. 1-105581 (105581/1989), by lamination of a first resin layer with light-transmitting property, insulating property and flexibility, a photo-electric converting element consisting of a transparent electrode layer, a thin-film semiconductor layer and a back electrode layer, and a second resin layer with insulating property and flexibility, in this order. The photovoltaic device in the aforementioned structure will be referred to as an ordinary type hereinafter. The other one is obtained by lamination of a first resin layer with insulative property and flexibility, a photo-electric converting element consisting of a back electrode layer, a thin-film semiconductor layer and a transparent electrode layer, and a second resin layer with light-transmitting property, insulative property and flexibility in this order, as unveiled in Japanese Patent Application Publication No. 63-10590 (10590/1988), which will be referred to as an inverse type hereinbelow. The light is allowed to be incident upon the photovoltaic device of the ordinary type from the side of the first resin layer, while it is arranged to enter from the side of the second resin layer according to the photovoltaic device of the inverse type.

Any type of the photovoltaic device is remarkably thin and accordingly easy to be cut by mechanical means. Therefore, if it is made possible to manufacture a plurality of photovoltaic devices at one time from one sheet of a photovoltaic device of a large area by cutting the sheet into a desired size and a desired shape, simplification of a production line is realized, with the using efficiency of the material being improved.

However, when the flexible photovoltaic device with the above-described structure is mechanically cut, the section of the cut photovoltaic device is undesirably bent or curved upward or downward, thereby causing a dangerous short circuit between the transparent electrode layer and back electrode layer at the section. If such an electric short circuit as above occurs, the output characteristic of the cut photovoltaic device is considerably decreased.

SUMMARY OF THE INVENTION

One object of this invention is to provide a manufacturing method of a photovoltaic device capable of preventing generation of an electric short circuit between a transparent electrode layer and a back electrode layer at a section.

A further object of this invention is to provide a manufacturing method of a photovoltaic device, capable of manufacturing easily a photovoltaic device of optional size, shape and output.

A still further object of this invention is to provide a manufacturing method of a photovoltaic device adapted to simplify a production line to a large extent.

A yet object of this invention is to provide a manufacturing method of a photovoltaic device designed to improve the using efficiency of material remarkably.

According to a manufacturing method of a photovoltaic device of this invention, a photovoltaic device of a large area of an ordinary type or an inverse type is mechanically cut into a desired size, and a resultant photovoltaic device of a smaller area is processed through thermal treatment within the temperature range where a first resin layer and a second resin layer are softened.

A manufacturing method of a photovoltaic device of this invention further features removal through etching of at least either one of a transparent electrode layer and a back ele trode layer at the section of a photovoltaic device of a smaller area which is mechanically cut into a desired size from a photovoltaic device of a large area of an ordinary type or an inverse type.

Owing to the thermal treatment of the photovoltaic device of a smaller area of the removal by etching of at least a transparent electrode layer or a back electrode layer at the section of the cut photovoltaic device of a smaller area, short-circuiting of the transparent electrode layer and back electrode layer at the section can be prevented according to this invention.

The above and further objects and features of the invention will more fully be apparent from the following detailed description with accompanying drawings.

DESCRIPTION OF THE PREFERRED EMBODIMENTS

A manufacturing method of a photovoltaic device according to preferred embodiments of this invention will be depicted hereinbelow in a detailed manner with reference to the accompanying drawings.

A manufacturing method of this invention is applicable to any type of the photovoltaic device, that is, ordinary type and inverse type. A manufacturing method of a photovoltaic device of an ordinary type will be discussed as a first and a second embodiment of this invention, and a manufacturing method of a photovoltaic device of an inverse type will be described as a third and a fourth embodiments of this invention.

FIRST EMBODIMENT

Figure 1:
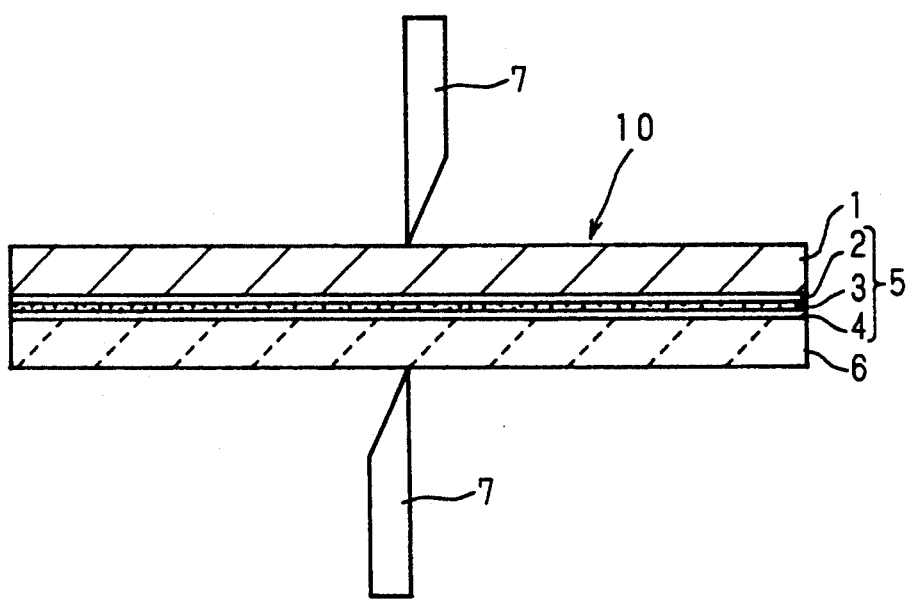
FIG. 1 is a cross sectional view of a first step of a manufacturing method according to a first and a second embodiments of this invention.

In a first step of a manufacturing method of a first embodiment shown in FIG. 1, a first resin layer 1 allowing the light to pass therethrough, a photo-electric converting element 5 comprised of a transparent electrode layer 2, a thin-film semiconductor layer 3 and a back electrode layer 4 are laminated over a second resin layer 6 in this order, whereby a photovoltaic device 10 is prepared. For obtaining the above photovoltaic device 10, as is disclosed in detail in Japanese Patent Application Laid-Open No. 1-105581 (105581/1989), the first resin layer 1 of transparent polyimide or the like is formed 5-100 $\mu$m thick on a supporting substrate (not shown) made of glass etc., and the transparent electrode layer 2, thin-film semiconductor layer 3 made of amorphous semiconductor such as amorphous silicon etc., and back electrode layer 4 in the laminated structure of Al (alminum) and Ti (titanium) are sequentially layered on the first resin layer 1. Then, after the second resin layer 6 made of PET (polyethylene terephthalate) with adhesive or the like is further laminated, the first resin layer 1 is peeled from the supporting substrate.

Figure 2:
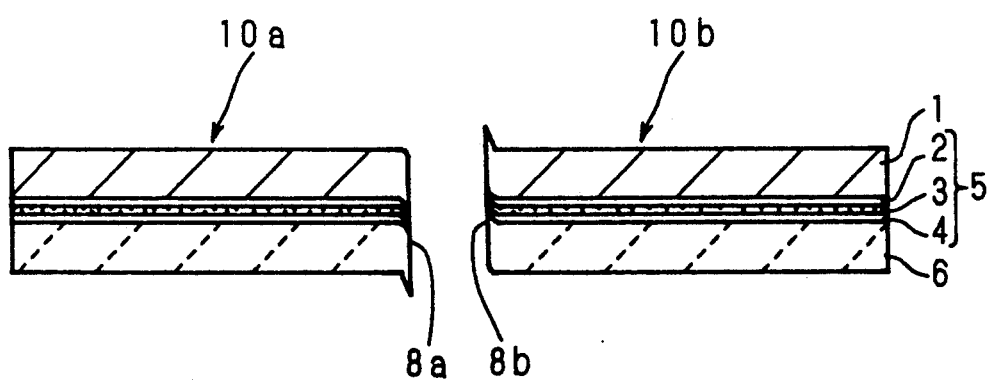
FIG. 2 is a cross sectional view of a second step of the manufacturing method according to the first and second embodiments of this invention.
Figure 3:
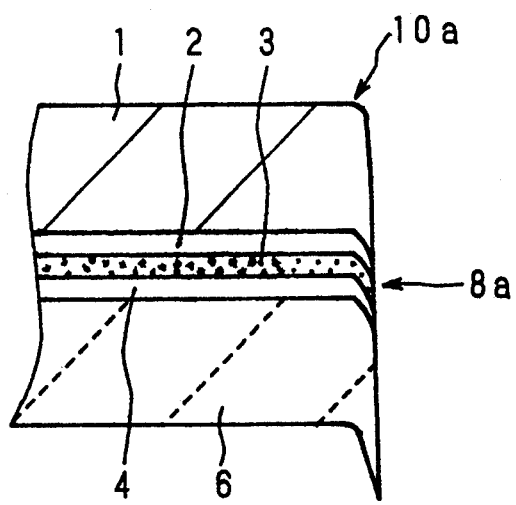
FIG. 3 is a cross sectional view of an essential part of FIG. 2 on an enlarged scale.

In a second step of FIG. 2, the photovoltaic device 10 prepared as above is mechanically cut in a vertical direction into a suitable size by means of a pair of cutter blades 7, 7 holding the photovoltaic device therebetween. As a result, the photovoltaic device is divided into two photovoltaic devices 10a, 10b in the instant embodiment. The sections 8a, 8b of the respective photovoltaic devices 10a, 10b are bent upward or downward following the movement of the cutter blades 7, 7. The state at this time is illustrated on an enlarged scale in FIG. 3 which, however, shows only the photovoltaic device 10a whose section 8a is bent downward. As is understood from FIG. 3, there still remains a possibility that the transparent electrode layer 2 be electrically short-circuited with the back electrode layer 4 at the sections 8a, 8b.

Figure 4:
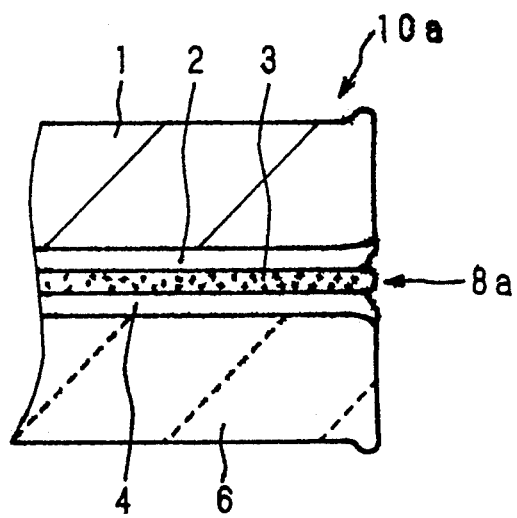
FIG. 4 is a cross sectional view of a third step of the manufacturing method according to the first embodiment of this invention.

In a third step indicated in FIG. 4, the cut photovoltaic devices 1a, 1b are put in a heating furnace, heated for about 60 minutes in the temperature range of 50°-100° C., and then kept at room temperature. It is to be noted here that FIG. 4 illustrates the photovoltaic device 10a alone. Because of the heating as above, the first and second resin layers 1, 6 are softened, repeating thermal expansion and thermal shrinkage, to be flat at the section 8a. The transparent electrode layer 2 and back electrode layer 4 are pulled and moved by the first and second resin layers 1, 6, respectively, so that the layers 2, 4 become flat as well. Accordingly, an electric short circuit at the section 8a is avoided. It is enough to heat the resin layers 1, 6 during the thermal treatment up to the softening temperature thereof. Careful attention should be paid, however, since the thin-film semiconductor layer 3 and the like would be affected if the heating temperature were to high.

SECOND EMBODIMENT

Since a first and a second steps of a manufacturing method according to a second embodiment of this invention are the same as those of the first embodiment described hereinabove, the description thereof will be abbreviated here.

Figure 5:
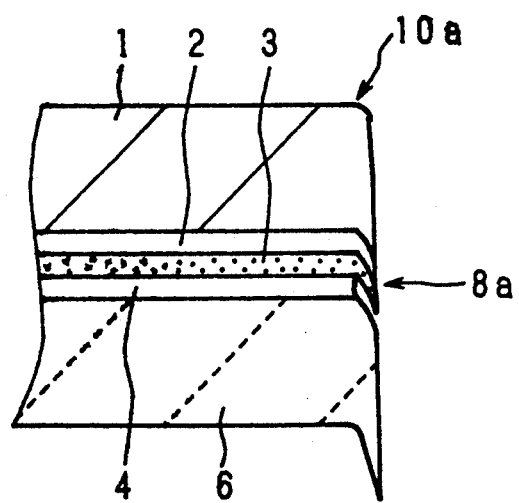
FIG. 5 is a cross sectional view of a third step of the manufacturing method according to the second embodiment of this invention.

In a third step of FIG. 5, the back electrode layer 4 exposed at the section 8a of the photovoltaic device 10a cut in the manner as illustrated in FIG. 2 is etched and removed several hundreds-several thousands $\mu$m from the section 8a. For instance, when the back electrode layer 4 is made of Al and Ti in the laminated structure, the section 8a is soaked for several minutes in a solution of hydrofluoric-nitric acid (HF+HNO$_3$) having the concentration of about 2%. As a result of the etching, the back electrode layer 4 retreats from the section 8a, thereby preventing an electric short circuit of the transparent electrode layer 2 and the back electrode layer 4.

Although the back electrode layer 4 is etched in the foregoing description, it may be possible to etch the transparent electrode layer 2, or both the electrode layers 2, 4.

THIRD EMBODIMENT

Figure 6:
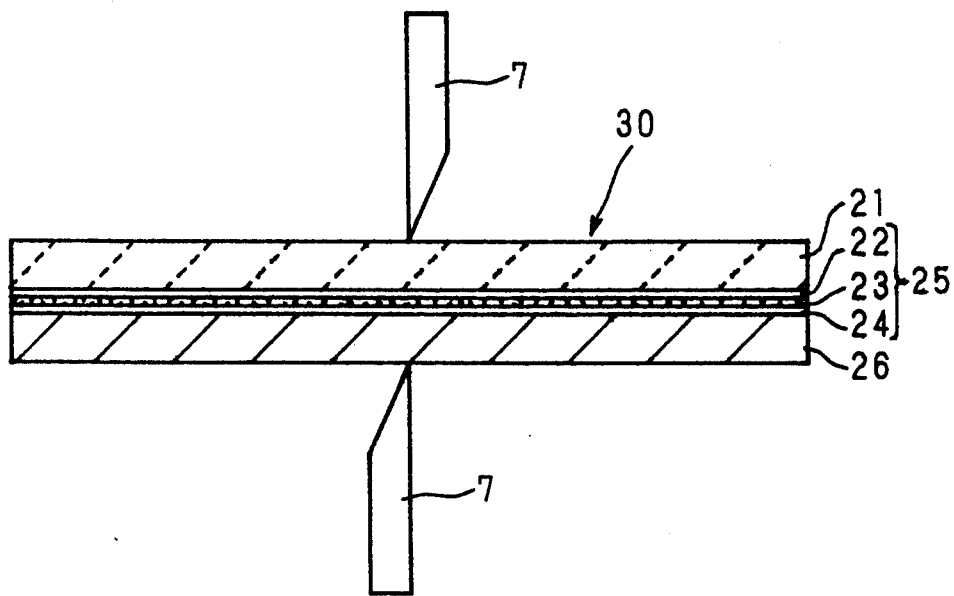
FIG. 6 is a cross sectional view of a first step of a manufacturing method according to a third and a fourth embodiment of this invention.

In a first step of a manufacturing method shown in FIG. 6 according to a third embodiment, a photovoltaic device 30 of a laminated body is prepared. More specifically, a first resin layer 21 (polyimide), a photo-electric converting element 25 comprised of a back electrode layer 22 (Al/Ti), a thin-film semiconductor layer 23 (amorphous silicon) and a transparent electrode layer 24 and, a second resin layer 26 (PET with adhesive) with light-transmitting property are laminated in this order.

Figure 7:
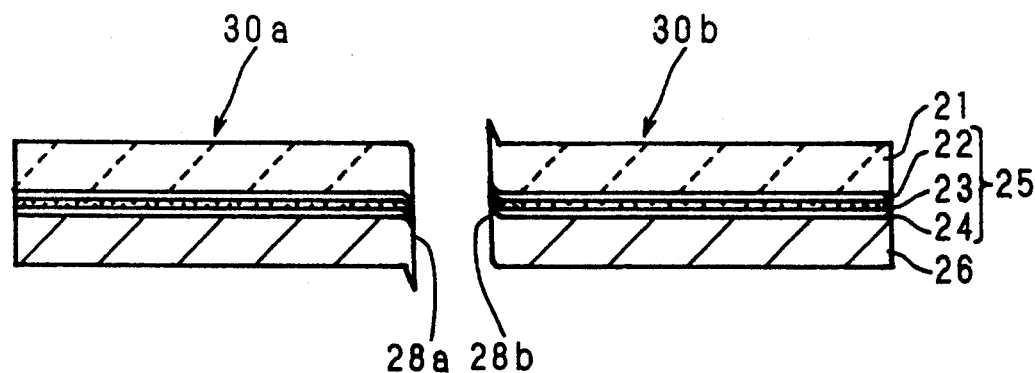
FIG. 7 is a cross sectional view of a second step of the manufacturing method according to the third and fourth embodiments of this invention.
Figure 8:
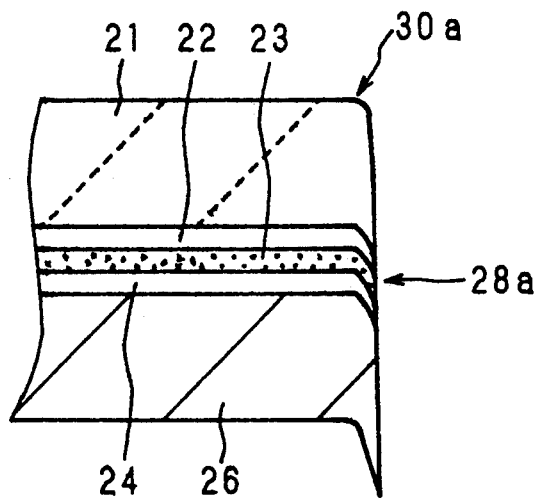
FIG. 8 is a cross sectional view of an essential part of FIG. 7 on an enlarged scale.

In a second step shown in FIG. 7, the prepared photovoltaic device 30 is mechanically cut into a suitable size by a pair of cutter blades 7, 7 moving in a vertical direction while holding the photovoltaic device 30 therebetween. The photovoltaic device 30 is cut into two photovoltaic devices 30a, 30b. The sections 28a, 28b of the cut photovoltaic devices 30a, 30b are bent upward or downward in accordance with the movement of the cutter blades 7, 7, which is shown in FIG. 8 on an enlarged scale. FIG. 8 indicates the bent state of only the photovoltaic device 30a, that is, downwardly-bent state. As is apparent from this FIG. 8, the transparent electrode layer 24 may be possibly electrically short-circuited with the back electrode layer 22 at the sections 28a, 28b.

Figure 9:
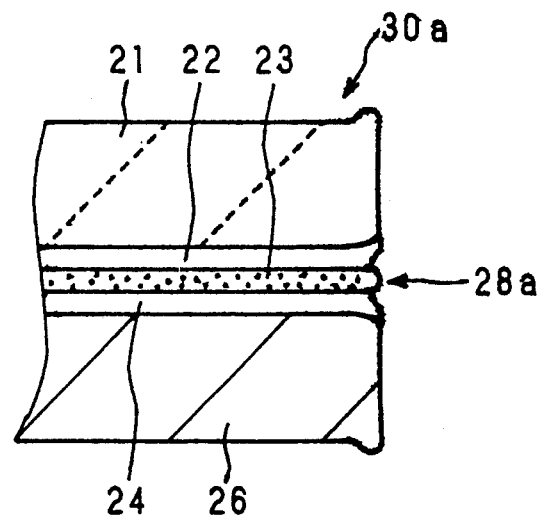
FIG. 9 is a cross sectional view of a third step of the manufacturing method according to the third embodiment of this invention.

In a third step of FIG. 9, the cut photovoltaic devices 30a, 30b are put in a heating furnace, heated for approximately 60 minutes in the temperature range of 50°-100° C. and left at the room temperature. Only the photovoltaic device 30a is shown in FIG. 9. The first resin layer 21 and second resin layer 26 are softened by the heating and turned flat at the section 28a through the thermal expansion and thermal shrinkage. During this process, the back electrode layer 22 and transparent electrode layer 24 are pulled by the first and second resin layers 21, 26, and become similarly flat. Consequently, an electric short circuit at the section 28a is solved. The thermal treatment is enough to be carried out at such a temperature as to soften the resin layers 21, 26. Otherwise, if the heating temperature is too high, the thin-film semiconductor layer 23 and the like may be adversely affected.

FOURTH EMBODIMENT

A first step and a second step of a manufacturing method according to a fourth embodiment of this invention proceed in the same fashion as the first and second steps of the third embodiment, the description of which will be abbreviated here.

Figure 10:
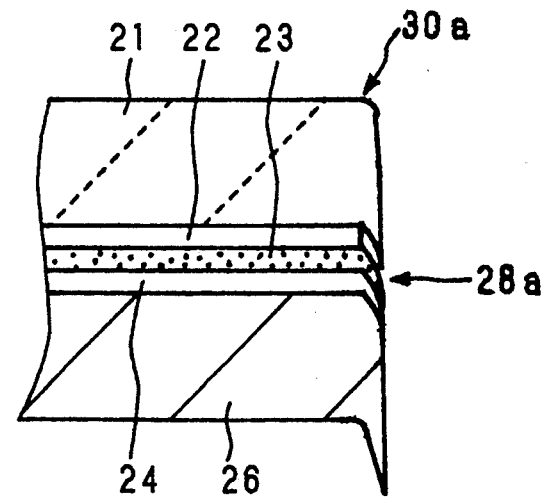
FIG. 10 is a cross sectional view of a third step of the manufacturing method according to the the fourth embodiment of this invention.

In a third step of the fourth embodiment shown in FIG. 10, the back electrode layer 22 exposed at the section 28a of the cut photovoltaic device 30a as shown in FIG. 7 is etched and removed several hundreds to several thousands μm from the section 28a. The etching treatment is, supposing that the back electrode layer 22 is a laminated structure of Al and Ti, achieved by soaking the section 28a into a solution of hydrofluoric-nitric acid of the concentration of about 2% for several minutes. As a result of the abovedescribed etching treatment, the back electrode layer 22 is withdrawn from the section 28a, thereby being prevented from being electrically short-circuited with the transparent electrode layer 24.

Although the etching treatment is conducted to the back electrode layer 22 in the above embodiment, the transparent electrode layer 24 may be etched or both the electrode layers 22, 24 may be etched.

Moreover, although there is provided only one photoelectric converting element 5 or 25 between the first and second resin layers 1 and 6, or 21 and 26 in the foregoing embodiments, this invention is nor restricted to such an arrangement as above, but a plurality of photo-electric converting elements which are electrically connected in series or parallel may be formed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A manufacturing method of a photovoltaic device, comprising:
   a step of forming a laminated body by laminating a first resin layer with light-transmitting property, a photoelectric converting element consisting of a transparent electrode layer, a thin-film semiconductor layer and a back electrode layer, and a second resin layer in this order;
   a step of cutting said laminated body into an optional size; and
   a step of heating the cut laminated body in a temperature range softening said first and second resin layers.

2. A manufacturing method of a photovoltaic device according to claim 1, wherein said first resin layer is made of polyimide and said second resin layer is made of polyethylene terephthalate with adhesive.

3. A manufacturing method of a photovoltaic device according to claim 2, wherein said cut laminated body is heated at temperature range 50°-100° C.

4. A manufacturing method of a photovoltaic device according to claim 1, wherein said thin-film semiconductor layer is made of amorphous semiconductor.

5. A manufacturing method of a photovoltaic device according to claim 4, wherein said amorphous semiconductor is amorphous silicon.

6. A manufacturing method of a photovoltaic device, comprising:
   a step of forming a laminated body by laminating a first resin layer with light-transmitting property, a photoelectric converting element consisting of a transparent electrode layer, a thin-film semiconductor layer and a back electrode layer, and a second resin layer in this order;
   a step of cutting said laminated body into an optional size; and
   a step of etching and removing at least one of the transparent electrode layer and back electrode layer at a section of the cut laminated body.

7. A manufacturing method of a photovoltaic device according to claim 6, wherein said back electrode layer has a laminated structure of aluminum and titanium.

8. A manufacturing method of a photovoltaic device according to claim 7, wherein the back electrode layer at the section of said cut laminated body is etched and removed through wet etching using a solution of hydrofluoric-nitric acid as etching solution.

9. A manufacturing method of a photovoltaic device, comprising:
   a step of forming a laminated body by laminating a first resin layer, a photo-electric converting element consisting of a back electrode layer, a thin-film semiconductor layer and a transparent electrode layer, and a second resin layer with light-transmitting property in this order;
   a step of cutting said laminated body into an optional size; and
   a step of heating the cut laminated body in a temperature range softening said first and second resin layers.

10. A manufacturing method of a photovoltaic device according to claim 9, wherein said first resin layer is made of polyimide and said second resin layer is made of polyethylene terephthalate with adhesive.

11. A manufacturing method of a photovoltaic device according to claim 10, wherein said cut laminated body is heated at temperature range 50°-100° C.

12. A manufacturing method of a photovoltaic device according to claim 9, wherein said thin-film semiconductor layer is made of amorphous semiconductor.

13. A manufacturing method of a photovoltaic device according to claim 12, wherein said amorphous semiconductor is amorphous silicon.

14. A manufacturing method of a photovoltaic device, comprising:
   a step of forming a laminated body by laminating of a first resin layer, a photo-electric converting element consisting of a back electrode layer, a thin-film semiconductor layer and a transparent electrode layer, and a second resin layer with light-transmitting property in this order;
   a step of cutting said laminated body into an optional size; and
   a step of etching and removing at least one of the back electrode layer and transparent electrode layer at a section of the cut laminated body.

15. A manufacturing method of a photovoltaic device according to claim 14, wherein said back electrode layer has a laminated structure of aluminum and titanium.

16. A manufacturing method of a photovoltaic device according to claim 15, wherein the back electrode layer at the section of said cut laminated body is etched and removed through wet etching using a solution of hydrofluoric-nitric acid as etching solution.

* * * * *